(12) United States Patent
Okanishi

(10) Patent No.: US 7,309,893 B2
(45) Date of Patent: Dec. 18, 2007

(54) SEMICONDUCTOR DEVICE AND METHOD OF FABRICATING THE SAME

(75) Inventor: Masatomi Okanishi, Aizuwakamatsu (JP)

(73) Assignee: Spansion LLC, Sunnyvale, CA (US)

( * ) Notice: Subject to any disclaimer, the term of this patent is extended or adjusted under 35 U.S.C. 154(b) by 322 days.

(21) Appl. No.: 11/152,547

(22) Filed: Jun. 14, 2005

(65) Prior Publication Data

US 2006/0281259 A1 Dec. 14, 2006

Related U.S. Application Data

(63) Continuation of application No. PCT/JP2004/008319, filed on Jun. 14, 2004.

(51) Int. Cl.
H01L 29/788 (2006.01)
(52) U.S. Cl. ........................ 257/321; 257/322
(58) Field of Classification Search ............... 257/321, 257/322
See application file for complete search history.

(56) References Cited

U.S. PATENT DOCUMENTS 5,796,140 A 8/1998 Tomioka .................. 257/316
6,909,138 B2 * 6/2005 Forbes ..................... 257/315
2002/0084484 A1 7/2002 Kurihara et al. ........... 257/315
2003/0224564 A1 12/2003 Kang et al. ................ 438/200

FOREIGN PATENT DOCUMENTS

| JP | 8-64697 | 3/1996 |
|---|---|---|
| JP | P2001-77215 A | 3/2001 |
| JP | 2001-148430 | 5/2001 |
| JP | 2004-15051 A | 1/2004 |

* cited by examiner

*Primary Examiner*—Roy Potter

(57) ABSTRACT

A semiconductor device includes a substrate having a pair of first diffused regions, and a gate including an oxide film provided on the substrate, and a charge storage layer provided on the oxide film, the charge storage layer being an electrical insulator capable of storing charges in bit areas. The oxide film has first portions related to the bit areas and a second portion that is located between the bit areas and is thicker than the first potions. The first portions serve as tunneling oxide portions, while the second portion allows reduced tunneling.

13 Claims, 9 Drawing Sheets

SEMICONDUCTOR DEVICE AND METHOD OF FABRICATING THE SAME

CROSS REFERENCE TO RELATED APPLICATION

This is a continuation of International Application No. PCT/JP2004/008319, filed Jun. 14, 2004.

BACKGROUND OF THE INVENTION

1. Field of the Invention

The present invention relates to a semiconductor device and a method of fabricating the same, and more particularly, to a read only or programmable non-volatile semiconductor device capable of storing charges in a gate insulation film and a method of fabricating the same.

2. Description of the Related Art

The semiconductor memories are categorized into a volatile type in which information is lost by power off and a non-volatile type in which information is retained even by power off. A typical-example of the latter non-volatile memory is a flash memory capable of erasing all data in an area at once, so that the rewriting time can be reduced.

Recently, there has been proposed a multi-bit cell structure, which may have has a MNOS (Metal (gate)-Nitride-Oxide-Silicon) structure or a SONOS (Silicon (gate)-Oxide-Nitride-Oxide-Silicon) structure. These structures employ an ON (Oxide-Nitride) structure or an ONO (Oxide-Nitride-Oxide) structure as a gate insulation film just under the gate electrode. The multi-bit cell structure is implemented by locally storing a charge in a region in a nitride ($Si_3N_4$) film provided in the vicinity of the source and drain of a transistor and locally storing another charge in another region. The multi-bit structure increases the cell capacity and reduces the bit cost. For instance, two local regions for storing charges in the $Si_3N_4$ film enable a single cell to store two bits (2 bits/cell).

The floating gate structure conventionally employed in the flash memory has an electrically conductive polysilicon film, which is sandwiched between silicon oxide films and is used to store the charge. The floating gate structure has a disadvantage in that the charge may leak because of the use of the conductive polysilicon for storing the charge, and data may be lost. In contrast, the MNOS or SONOS structure does not have the above disadvantage because the charges are stored in the nitride compound that is electrically insulative.

FIGS. 1A and 1B are respectively cross-sectional views of a memory used to explain the method of fabricating a multi-bit memory cell having a gate of the SONOS structure, and a source and a drain having a buried bit line structure. More particularly, FIG. 1 shows a core area of the memory, and FIG. 1B shows a memory peripheral area.

In the core area, n-type diffused regions 102 used as bit lines and formed by diffusion of As are arranged at given intervals on the main surface of a p-type semiconductor substrate 100. Each section between the adjacent n-type diffused regions 102 is a channel region. A tunnel oxide film 103 having a uniform thickness is provided on the channel regions and the n-type diffused regions. A nitride film 104, an upper oxide film 105 and a not-shown control gate are laminated on the tunnel oxide film 103 in turn, so that the gate is formed by the four laminated layers. The nitride film 104 is electrically insulative, and electrons injected through the tunnel oxide film 103 are stored therein.

The conventional memory with the conductive floating gate is capable of storing one bit per cell because the electrons injected through the tunnel oxide film are spatially distributed in the floating gate so as to have a uniform electric field distribution and the whole floating gate serves as a charge storage region. In contrast, the memory with the gate of the MNOS or SONOS structure allows the electrons injected in the nitride film 104 of the insulator to be locally arranged and stored therein without being distributed, so that a multi-bit structure (many-valued structure) can be achieved. An ion implantation 101 is implemented in the p-type semiconductor substrate 100 in the core area for the purpose of adjusting the threshold value of each bit.

In the memory peripheral area (peripheral circuit area), well regions 106 are arranged at given intervals on the main surface of the semiconductor substrate 100. LOCOS regions 107 for device isolation are provided between the well regions 106, wherein the LOCOS regions 107 are formed by locally making a thin oxide film 108 thicker. The nitride film 104 and the upper oxide film 105 are laminated in turn on the oxide film 108 and the LOCOS regions 107.

The multi-bit cell thus structured may be fabricated by the following process. First, a first oxide film is formed on the semiconductor substrate 100, and the well regions 106 are formed in the peripheral circuit area by ion implantation. More specifically, the thin oxide film on the semiconductor substrate 100 is coated with a resist, which is then patterned. Thereafter, ions are implanted in the semiconductor substrate 100 with the patterned resist being used as a mask, so that the well regions 106 can be defined.

Next, the LOCOS regions 107 for device isolation are formed in the peripheral circuit area. This may be done by forming a SiN film on the semiconductor substrate and providing a resist thereon, which is then patterned. The SiN film is etched with the patterned resist serving as a mask for forming the LOCOS. Thereafter, the semiconductor substrate 100 is locally oxidized through openings, so that the LOCOS regions 107 are formed. After removal of the resist, the SiN film remaining in the core area is removed.

Then, a resist is provided and patterned, and ion implantation is carried out with the patterned resist. Ions are implanted through the openings of the patterned resist, so that the channel implantation region 101 for the adjustment of the threshold value can be formed in the semiconductor substrate 100.

Subsequent to the above, the resist and the thin oxide film are removed, and the tunnel oxide film 103 and the nitride film 104 for the charge storage are formed. A patterned resist is provided on the nitride film 104 and ions are implanted in the semiconductor substrate 101 through the openings of the patterned resist, so that the n-type oxide regions 102 are formed.

Finally, the resist is removed and the upper oxide film 105 is deposited on the nitride film 104.

The multi-bit cell of the SONOS structure can be independently programmed for each of the bits of the cell. Thus, the cell capacity can be increased and the bit cost can be reduced.

However, the conventional multi-bit cell of the MNOS structure or SONOS structure has the tunnel oxide film having the uniform thickness, which determines the storage location of the charge due to the electron-injected position depending on the potential inclination between the source and drain regions. As the amount of charge stored in each bit increases in the progress of programming, the bit region that stores a large amount of charge tends to gradually spread towards the channel center from the vicinity of the drain in the nitride film. The spreading of the bit region causes another bit that stores only a small amount of charge to equivalently function to storage a large amount of charge that exceeds the real amount of charge and to raise the threshold value of that bit. This may cause a data read error.

SUMMARY OF THE INVENTION

The present invention has been made taking the above problems into consideration, and has an object of providing a semiconductor device capable of normally programming each bit in the same cell without being affected by the amounts of charges in the other bit or bits and further miniaturizing the SONOS cell structure without degrading the programming and read performance, and a method of manufacturing such a semiconductor device.

According to an aspect of the present invention, there is provided a semiconductor device including: a substrate having a pair of first diffused regions; and a gate including an oxide film provided on the substrate, and a charge storage layer provided on the oxide film, the charge storage layer being an electrical insulator capable of storing charges in bit areas, the oxide film having first portions related to the bit areas and a second portion that is located between the bit areas and is thicker than the first potions, the first portions serving as tunneling oxide portions, while the second portion allows reduced tunneling.

In the above semiconductor device, preferably, the first diffused regions selectively serve as a source and a drain in accordance with a condition for biasing, and the pair of first diffused regions are symmetrically arranged at both ends of a channel.

In the above semiconductor device, preferably, the substrate includes a threshold control region that controls threshold levels of the bit areas.

Preferably, the semiconductor device may further include a second diffused region in which the pair of first diffused regions is located. The second diffused region may be located between the pair of first diffused regions. In these cases, it is preferable that the second diffused region that is separate from the pair of first diffused regions. It is also preferable that the second diffused region is separate from the pair of first diffused regions and is located at a central portion of the channel. It is preferable that the second diffused region extends vertically from a surface of the substrate.

Preferably, the threshold control region includes an ion-implanted region.

The pair of first diffused regions may have a buried bit line structure, and the semiconductor device may include a plurality of pairs of first diffused regions.

In the semiconductor device, the substrate may be a silicon substrate, and the oxide film may be a silicon oxide film, the charge storage layer being a silicon nitride film. In this case, the gate may have a MNOS (Metal-Nitride-Oxide-Semiconductor) or SONOS (Silicon-Oxide-Nitride-Oxide-Semiconductor) structure.

In the semiconductor device, the second diffused region contains a dopant of, for example, boron, and the first diffused regions contain a dopant of, for example, arsenide.

According to another aspect of the present invention, there is provided a method of fabricating a semiconductor device comprising the steps of: (a) forming a tunneling oxide film having a uniform thickness on a substrate; (b) forming a pair of first diffused regions in the substrate; (c) forming a surface protection film provided on the tunneling oxide film and located above the pair of first diffused regions; and (d) re-oxidizing the tunneling oxide film exposed through the surface protection film so that the tunneling oxide film has a self-aligned portion having a thickness that allows reduced tunneling of charges.

The steps (a) and (d) may include a thermal or plasma oxidization process.

The method may further include a step (e) of forming a second diffused region that is located between the pair of first diffused regions and extends vertically from a surface of the surface on which the tunneling oxide film is formed. Preferably, the step (e) uses sidewalls of the surface protection film so that the second diffused region is self-aligned. Preferably, the step (e) forms the second diffused region by ion implantation.

In the above-mentioned method, the step (b) may include a step of forming a patterned resist having windows to which sidewalls are provided, so that the pair of first diffused regions is self-aligned using the sidewalls. Preferably, the step (b) forms the pair of first diffused regions by ion implantation.

BRIEF DESCRIPTION OF THE DRAWINGS

Preferred embodiments of the present invention will be described in detail based on the following figures, wherein.

DESCRIPTION OF THE PREFERRED EMBODIMENTS

First, a description will be given, with reference to the accompanying drawings, of the fundamental structure of the semiconductor device. The following description is primarily directed to the gate of the SONOS structure. However, the present invention is not limited to the SONOS structure but includes another gate composed of a charge storage layer and a gate electrode laminated thereon. The present invention may include the gate of the MNOS structure. In the following description, by way of example, the semiconductor substrate is made of silicon, the oxide film is a silicon oxide film, and the charge storage layer is a silicon nitride film.

Figure 1A:
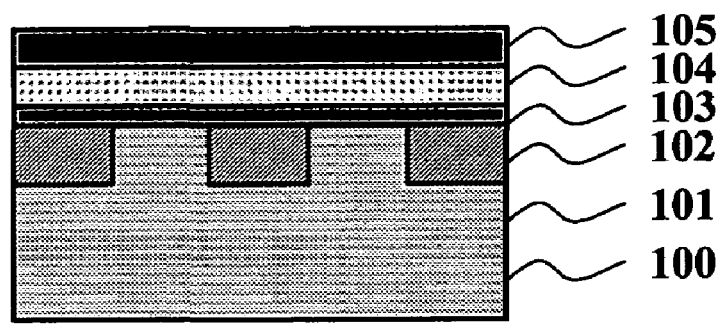
FIG. 1A is a cross-sectional view of a core area of a memory used to explain the method of fabricating a multi-bit memory cell having a gate of the SONOS structure, and a source and a drain having a buried bit line structure.
Figure 1B:
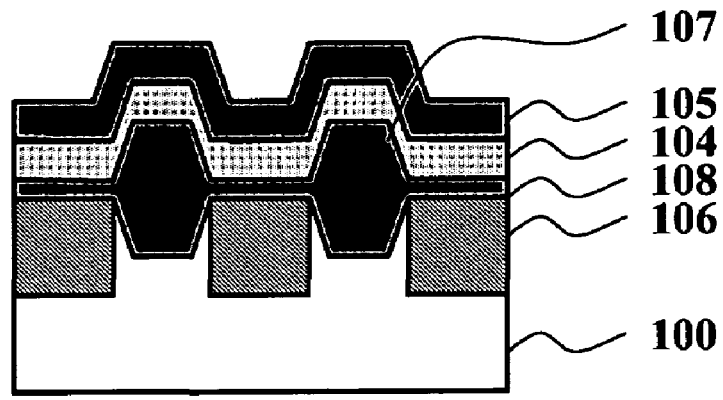
FIG. 1B is a cross-sectional view of a peripheral area of a memory used to explain the method of fabricating a multi-bit memory cell having a gate of the SONOS structure, and a source and a drain having a buried bit line structure.
Figure 2A:
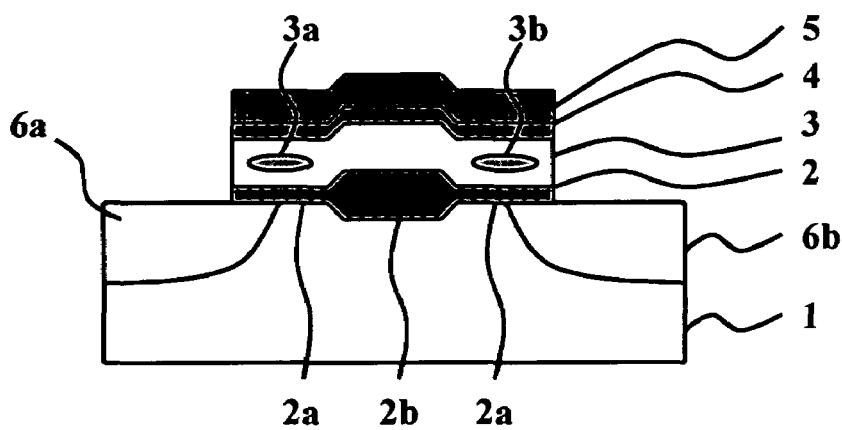
FIG. 2A is a cross-sectional view of a cell for explaining a fundamental structure of the semiconductor device of the present invention.
Figure 2B:
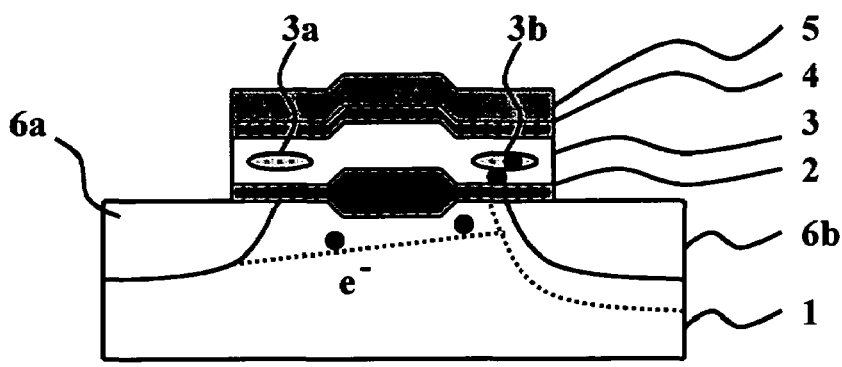
FIG. 2B is a schematic cross-sectional view of a core region for explaining the operational principles of the semiconductor device of the present invention.
Figure 2C:
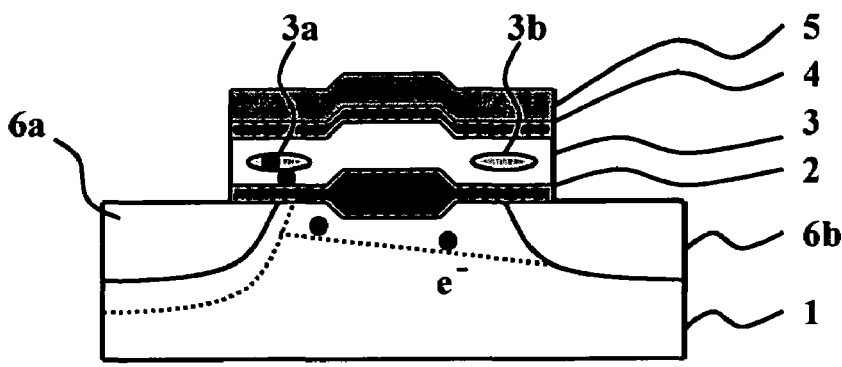
FIG. 2C is a schematic cross-sectional view of a peripheral area for explaining the operational principles of the memory cell of the present invention.

FIG. 2A is a cross-sectional view for explaining the fundamental structure of the semiconductor device of the present invention, and FIGS. 2B and 2C are respectively schematic cross-sectional views of the cell for explaining the operational principles of the semiconductor device of the present invention.

The semiconductor device has n-type diffused regions 6a and 6b, which are arranged at given intervals on the main surface of a semiconductor device 1 of, for example, a p type, and are formed by, for example, implantation of As ions. A region between the adjacent n-type diffused regions 6a and 6b is a channel region. A tunnel oxide film 2 is provided on the channel region, and is composed of a central portion 2b having a relatively thick film thickness and end portions 2a having a relatively thin film thickness. The end portions 2a are partially provided on the n-type diffused regions 6a and 6b. The end portions 2a of the tunnel oxide film 2 function as tunnel oxide films, and the central portion 2b thereof functions to restrain charge transportation due to the tunneling effect. For the convenience' sake, the end portions 2a and the central portion 2b are called as the tunnel oxide film 2 as a whole.

A nitride film 3, a silicon oxide film 4 and a control gate 6 are laminated on the tunnel oxide film 2 in turn, and the gate is composed of these four layers. The nitride film 3 is electrically insulative, and has multiple bit regions spaced part from each other. Electrons injected through the tunnel oxide film are stored in the nitride film 3.

The device with the conductive floating gate has a spatial distribution of electrons injected through the tunnel oxide film 2a so as to have a uniform electric field distribution in the floating gate. Thus, the charge storage region extends over the whole floating gate. Therefore, only one bit is available for one cell. In contrast, the semiconductor device having the gate of the SONOS structure as shown in FIG. 2A allows the electrodes injected to the electrically insulative nitride film 3 to be locally arranged and retained therein without diffusing in the nitride film 3.

More specifically, when the n-type diffused regions 6a and 6b are respectively the source and drain regions (see FIG. 2B), the electrons (shown by black solid circles) are injected through the right end portion 2a of the tunnel oxide film 2 and are stored in the charge storage region 3b. Alternatively, when the n-type diffused regions 6a and 6b are respectively the drain and source regions (see FIG. 2C), the electrons are injected through the left end portion 2b of the tunnel oxide film 2 and are stored in the charge storage region 3a. That is, a pair of n-type diffused regions spaced apart from each other at a given interval is a source/drain region that may be the source region or the drain region based on the biasing condition.

As described above, the two charge storage regions are formed in the single cell, and two bits are defined in the single cell. This increases the cell capacity and reduces the bit cost. The above-mentioned fundamental structure may optionally have an ion-injected region in the channel region for the adjustment of the threshold value on the bit basis.

The semiconductor device of the present invention has a unique structure in which the central portion of the tunnel oxide film 2 is thicker than the programming regions close to the drains. This structure weakens the electric field in the gate direction in the channel center portion, and programming is not carried out in the channel center portion. Thus, programming is limitedly carried out in the drain regions in which the tunnel oxide film is made thin. It is therefore possible to restrain variations of the threshold value due to the amounts of charges in the multiple charge storage regions (bits) within the same cell and to realize the normal read operation.

It is noted that Japanese Patent Application Publication No. 2001-148430 discloses a non-volatile semiconductor memory device in which the tunnel oxide film provided below the floating gate does not have a uniform thickness but has a convex portion that is located in the center and is thick and opposing end portions that are thin. This publication shows the following. The above-mentioned shape of the tunnel oxide film enables programming and erasing to be carried out in the thin end portions of the oxide film without degrading the speed, and greatly prevents leakage of charge in the floating gate even when a potential difference occurs between the well region and the control gate because the oxide film is thick in the central portion that is not involved in injecting and drawing out the charge. It is thus possible to improve the charge retention without degrading the performance of injecting and drawing out the electrons.

However, the semiconductor device of the present invention is quite different from the semiconductor device disclosed in the publication in the following.

First, the publication discloses the non-volatile semiconductor memory equipped with the floating gate such as the flash memory. The charge stored in the device is distributed over the whole electrically conductive floating gate. Thus, the single cell has only one charge storage region. In contrast, the semiconductor device of the present invention has the gate insulation film of the ONO structure (or the ON structure), and the nitride film that is a part of the gate and is capable of storing charges in local regions. Thus, the latter semiconductor device is equipped with two or more charge storage regions per cell.

Second, the non-volatile semiconductor memory device equipped with the floating gate disclosed in the above-mentioned publication has the two diffused regions, one of which is constantly the source region and the other is constantly the drain region. In contrast, the present invention has two diffused regions, each of which is the source region and is simultaneously the drain region.

Third, the semiconductor device of the present invention has a shape of the tunnel oxide film (and the effects thereof) different from that (those) of the semiconductor device described in the publication, resulting from the structural difference between these devices. The semiconductor device described in the publication has the shape having the central convex portion of the tunnel oxide film intended to retain the charge stored in the electrically conductive floating gate more properly and improve the data retention.

In contrast, the tunnel oxide film has the thin-film portions that are associated with the multiple bit regions spaced apart from each other in the electrically insulative charge storage layer, and the thick-film portion that is interposed between the thin-film portions and reduces the charge transportation due to the tunneling effect. With the tunnel oxide film thus designed, it becomes possible to restrain variations of the threshold values between the multiple charge storage regions (bits) due to the charge amounts and to realize the normal read operation.

Due to the differences in the structure and effects, the methods of fabricating the semiconductor device inevitably differ from each other. More particularly, the convex portion of the tunnel oxide film of the semiconductor device described in the publication is produced as follows. A region into which nitrogen is injected on the surface of the silicon substrate and another region in which no nitrogen is injected are formed. The thick oxide portion used as the convex portion is grown in the region into which no nitrogen is injected due to the difference in the growth rate of oxide films resulting from the difference in the concentration of nitrogen in the silicon crystal. Thus, the precision in positioning the convex portion is limited to +/−40 nm that is the precision of the stepper.

In contrast, in the semiconductor device of the present invention, each of the two diffused regions that form the channel is the source region and is simultaneously the drain region. It is thus required to form the thick central portion of the tunnel oxide film with high precision. The thick central portion of the tunnel oxide film is formed by the self-alignment process rather than the mask process. The use of the self-alignment process realizes the thick portion of the tunnel oxide film that is at an equal distance from the source/drain regions. The method of fabricating the semiconductor device of the present invention will be described later in detail.

The embodiments of the best mode will now be described below.

First Embodiment

Figure 3A:
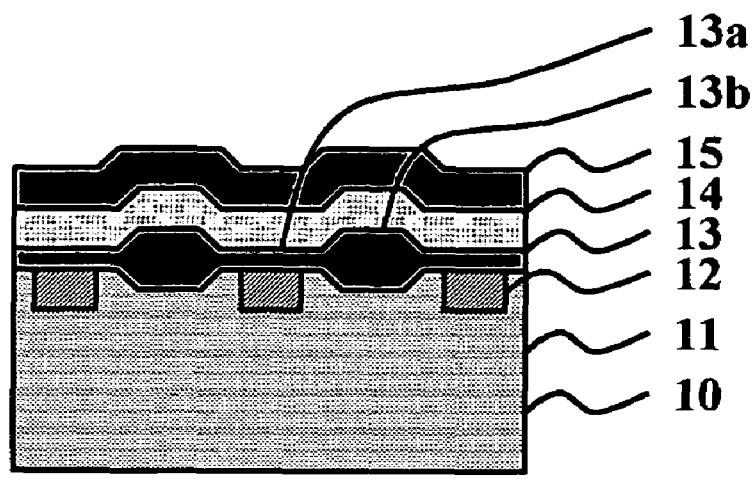
FIG. 3A is a cross-sectional view of the core region for explaining a first exemplary structure of the semiconductor device of the present invention that has the gate of the SONOS structure and the source and drain of the buried bit line structure.
Figure 3B:
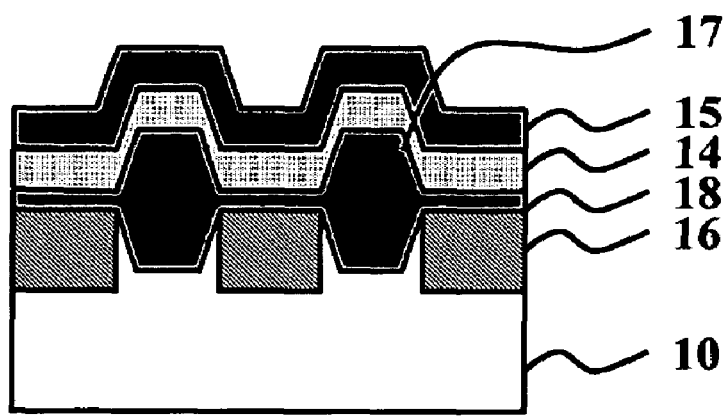
FIG. 3B is a cross-sectional view of the peripheral region for explaining the first exemplary structure of the semiconductor device of the present invention that has the gate of the SONOS structure and the source and drain of the buried bit line structure.

FIGS. 3A and 3B are respectively cross-sectional views of a cell having a first exemplary structure of the semiconductor device of the present invention that has the gate of the SONOS structure and the buried bit line structure. More particularly, FIG. 3A shows the core area, and FIG. 3B shows the cell peripheral area. In the core area, a plurality of cells are arrayed, and each of which cells has the fundamental structure shown in FIG. 2A, and operates as has been described with reference to FIGS. 2B and 2C.

FIGS. 4A through 6I are views for describing the process of fabricating the present semiconductor device, in which the left-side figures show the core area, and the right-side figures show the peripheral area.

In the core area, the n-type diffused regions 12 for the bit lines are formed, at equal intervals, on the main surface of the p-type semiconductor substrate 10 through As implantation. Each of the n-type diffused regions 12 functions as the source/drain region. Each region between the adjacent n-type diffused regions 12 is the channel region.

The tunnel oxide film 13 is provided on the channel regions and the n-type diffused regions 12. The tunnel oxide film 13 has portions (13a) that are located above the n-type diffused regions 12 and are made so thin as to allow writing of data by the tunneling effect. The tunnel oxide film 13 has portions (13b) that are located above the channel regions and are made so thick as to function to restrain the charge transportation due to the tunneling effect. The thick portions 13a of the tunnel oxide film 13 are, for example, 7 nm thick.

On the tunnel oxide film 13, laminated are the nitride film 14 for charge storage, the upper oxide film 15 and the not-shown control gate in turn, and the gates are formed by these four layers. The nitride film 14 is electrically insulative and is, for example, 12 nm thick. The electrons injected through the thin portions 13a of the tunnel oxide film are locally arranged and stored in the nitride film 14, so that the multi-bit cell structure can be implemented. The channel ion implantation 11 of, for example, B ions is carried out in the semiconductor substrate 10 for the purpose of adjusting the threshold value on the bit basis.

In the cell peripheral area (peripheral circuit area), the well regions 16 are formed on the main surface of the semiconductor substrate 10 at given intervals. The LOCOS regions 17 are provided between the adjacent well regions 16, wherein the LOCOS regions 17 are formed by locally making a thin oxide film 18 thick. The nitride film 14 and the upper oxide film 15 are sequentially formed on the oxide film 18 and the LOCOS regions 17.

The multi-bit cells can be produced as follows. The thin oxide film 18 (having a thickness of approximately 7 nm) is evenly formed on the main surface of the semiconductor substrate 10, and is coated with a resist, which is then patterned so as to have openings in given positions in the cell peripheral area. Thereafter, ion implantation is carried out with the resist pattern being used as a mask, so that the well regions 16 are formed.

Figure 4A:
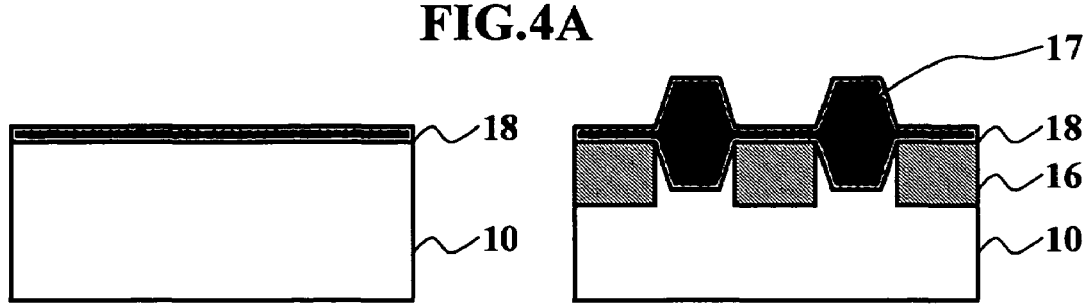
FIG. 4A through 4C are respectively views for describing a method of fabricating the semiconductor device shown in FIGS. 3A and 3B.

Next, a not-shown SiN film is formed on the semiconductor device 10, and a resist pattern having openings at given position in the cell peripheral area is formed on the SiN film. The SiN is etched through the openings of the mask and the semiconductor substrate 10 is locally oxidized so that the LOCOS regions 17 are formed. After the LOCOS regions 17 are formed, the resist pattern is removed and the SiN film remaining in the core area is removed (FIG. 4A).

Subsequent to the forming of the LOCOS regions 17, the resist pattern having an opening through which the core area is exposed is formed, and B ions are implanted at a given dose (equal to, for example, $6 \times 10^{12}$ cm$^{-2}$) and 40 keV. In this manner, the channel ion implantation 11 for the adjustment of the threshold values is carried out.

Figure 4B:
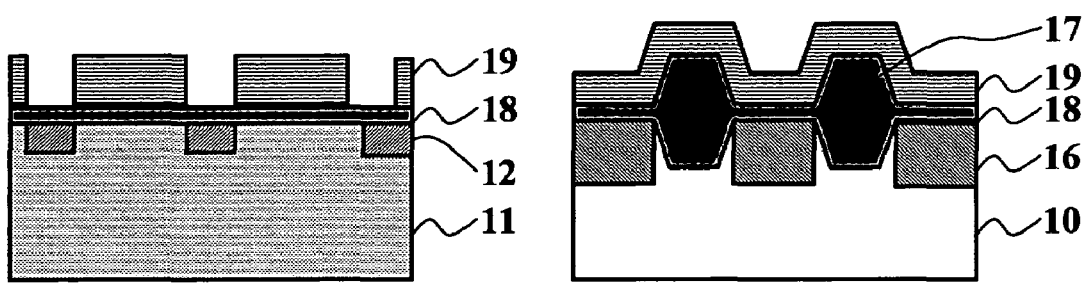
Figure 4C:
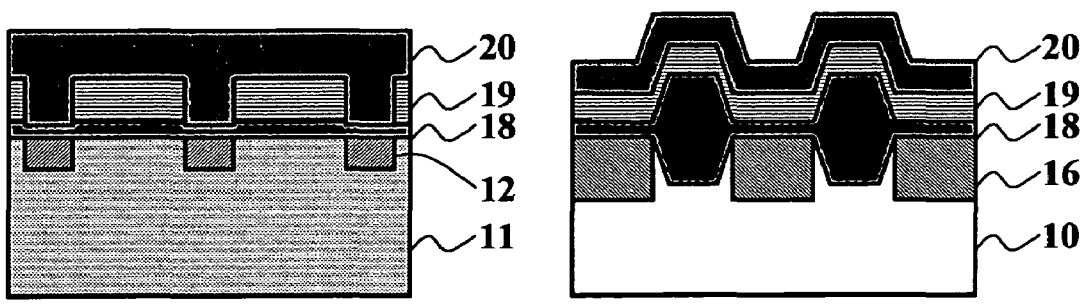

After the removal of the resist, a polysilicon film 19 is deposited on the entire surface to a thickness of 200 nm, and is partially removed in the core area with a mask formed of resist used for forming the bit lines using the photolithographic technique. The remaining polysilicon film 19 is used as a mask, and As ions are implanted through openings of the mask at a given dose (equal to, for example, $2 \times 10^{15}$ cm$^{-2}$) and 70 keV. In this manner, the n-type diffused regions 12 are formed (FIG. 4B).

Figure 5D:
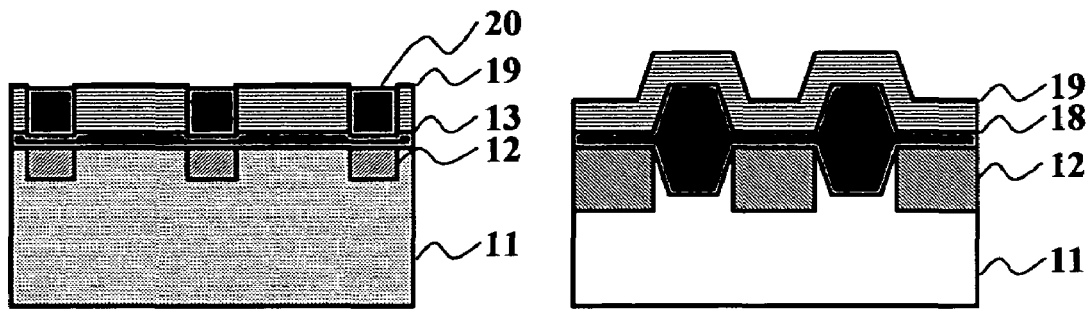
FIG. 5D through 5F are respectively views for describing the method of fabricating the semiconductor device shown in FIGS. 3A and 3B.
Figure 5E:
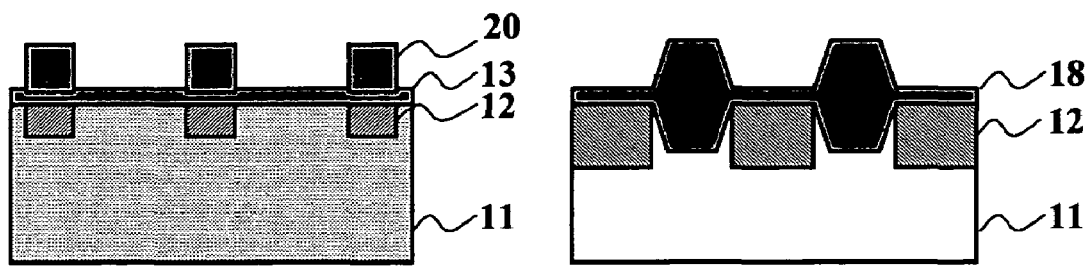
Figure 5F:
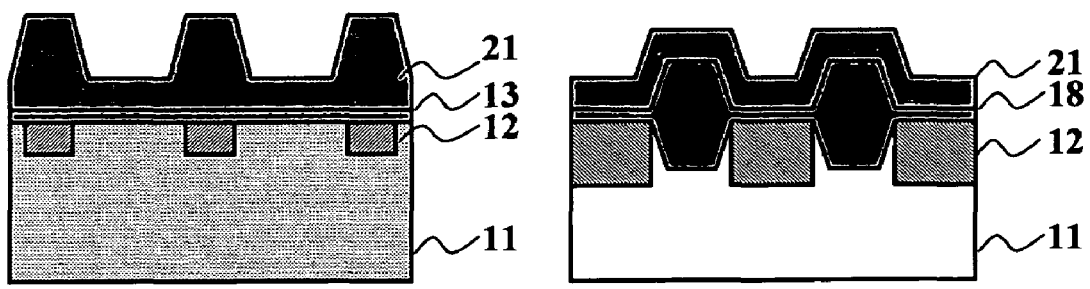

Then, a first nitride sidewall film 20 is deposited to a thickness of 300 nm (FIG. 4C), and is etched until the surface of the polysilicon film 19 is exposed (FIG. 5D). Further, the polysilicon film 19 is removed by etching so that only the nitride sidewall film 20 remains. Thus, almost the all polysilicon film 19 in the cell peripheral region is totally removed (FIG. 5E).

Figure 6G:
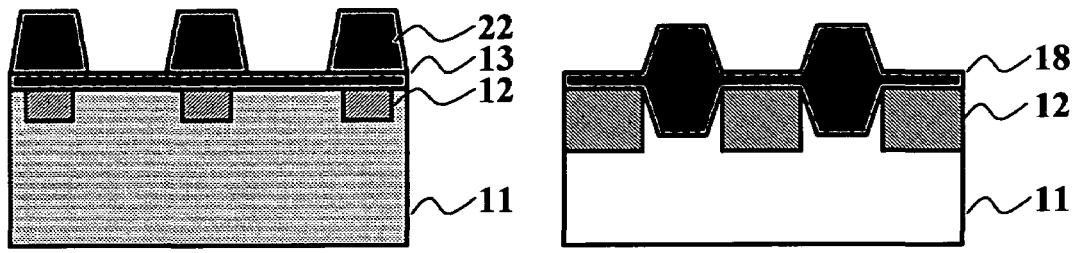
FIGS. 6G through 6I are respectively views for describing the method of fabricating the semiconductor device shown in FIGS. 3A and 3B.

Thereafter, a second nitride sidewall film 21 is deposited to a thickness of 100 nm to cover the whole surface. Then, the second nitride sidewall film 21 (and a part of the first nitride sidewall film 20) is etched to finally define nitride sidewall films 22 (FIG. 6G). At that time, the width of the openings between the adjacent nitride sidewall films 22 can be arbitrarily defined by controlling the thicknesses of the nitride sidewall films 22.

Figure 6H:
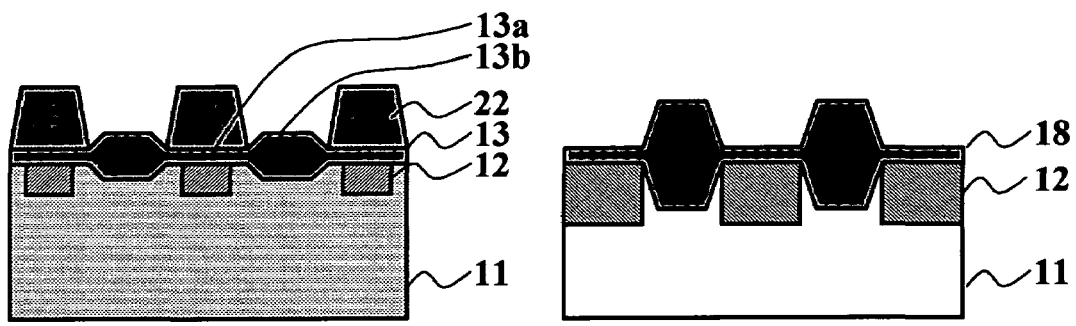

Subsequently, the oxide film 18 is etched in positions in which the openings between the nitride sidewall films 22 are located so that the surface of the semiconductor substrate 10 is exposed. Then, the exposed surface of the semiconductor substrate 10 is oxidized so as to have an appropriate thickness capable of restraining the charge transportation due to the tunneling effect. The remaining portions of the oxide film 18 after etching are the thin-film portions 13a (as thin as approximately 7 nm) of the tunnel oxide film 13, and the thick oxidized portions are the thick-film portions 13b thereof. In this manner, the tunnel oxide film 13 of the semiconductor device of the present invention is formed in the core area (FIG. 6H). The oxidizing process used may be thermal oxidation or plasma oxidization of low temperature and damage.

Figure 6I:
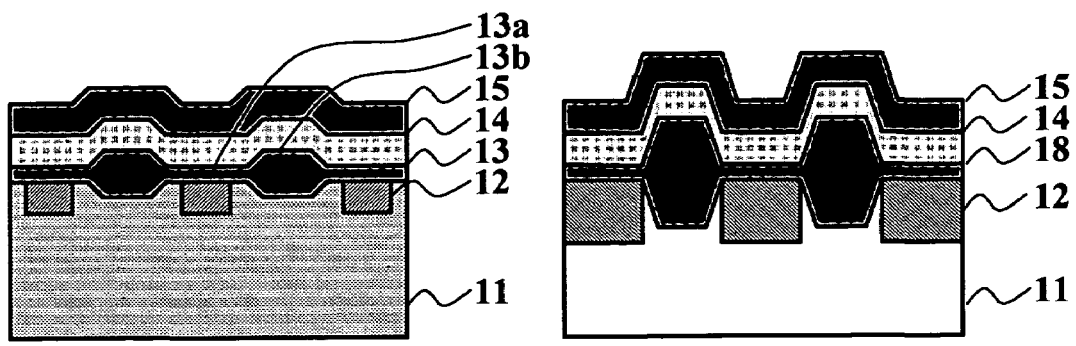

Finally, the nitride sidewall films 22 are removed, and the nitride film 14 and the upper oxide film 15 are sequentially deposited on the entire surfaces of the core area and the peripheral area. The nitride film 14 may be a film deposited to a thickness of approximately 12 nm by CVD, and has the charge storage regions in the core area. The upper oxide film 15 is, for example, 11.5 nm thick and may be deposited by CVD or plasma oxidization process of low temperature and damage (FIG. 6I).

Second Embodiment

Figure 7A:
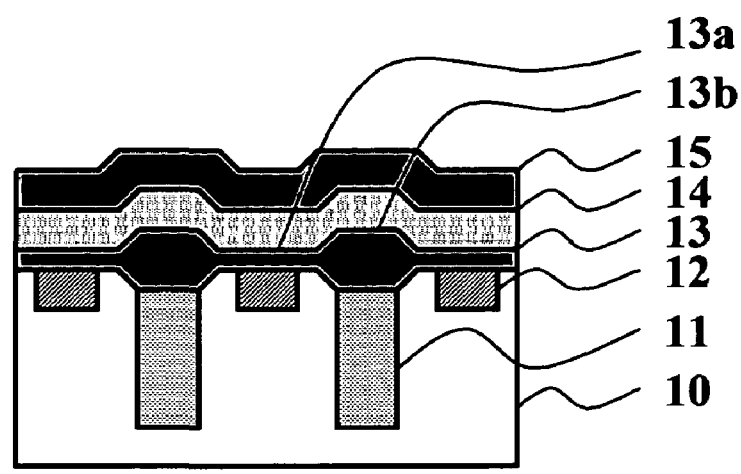
FIG. 7A is a cross-sectional view of the core region for explaining a second exemplary structure of the semiconductor device of the present invention that has the gate of the SONOS structure and the source and drain of the buried bit line structure.
Figure 7B:
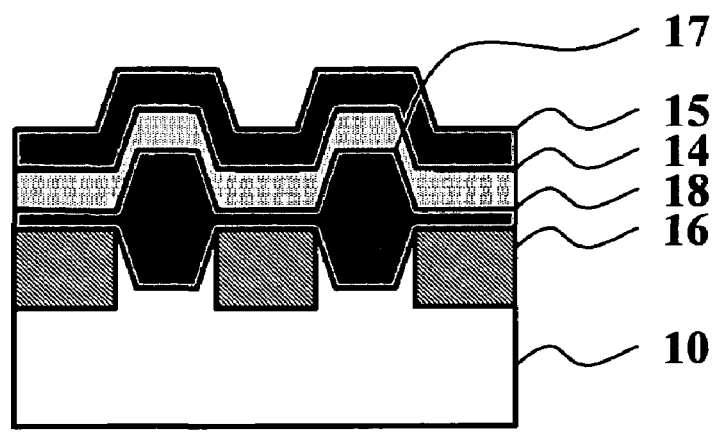
FIG. 7B is a cross-sectional view of the peripheral region for explaining the second exemplary structure of the semiconductor device of the present invention that has the gate of the SONOS structure and the source and drain of the buried bit line structure.
Figure 8A:
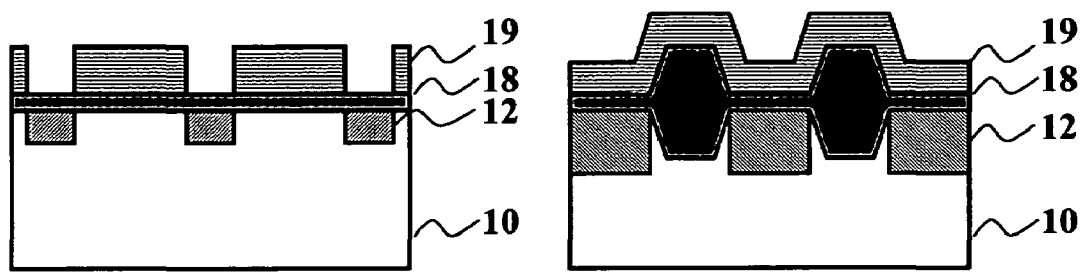
FIGS. 8A through 8C are respectively views for describing a method of fabricating the semiconductor device shown in FIGS. 7A and 7B.
Figure 8B:
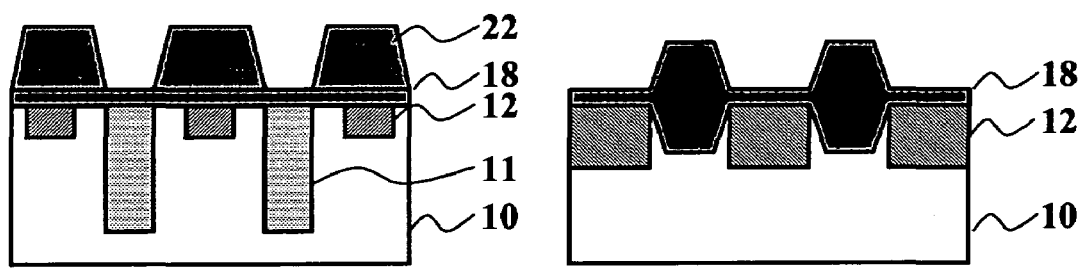
Figure 8C:
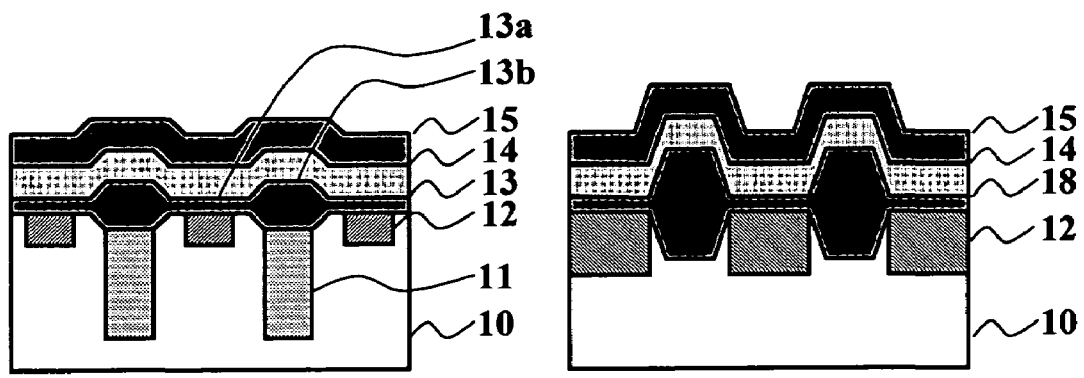

FIGS. 7A and 7B are respectively cross-sectional views of the cell having a second exemplary structure of the semiconductor device of the present invention. More particularly, FIG. 7A shows the core area, and FIG. 7B shows the cell peripheral area. FIGS. 8A through 8C show the process of fabricating the present semiconductor device, wherein the left-side figures show the core area and the right-side figures show the cell peripheral area.

The structure of the cell peripheral area of the semiconductor device is the same as that of the first exemplary structure shown in FIG. 3B. The structure of the core area shown in FIG. 7A differs from that of the first exemplary structure shown in FIG. 3A in that the first structure has the ion-implanted region 11 for the adjustment of the threshold values applied to the whole surface of the semiconductor substrate 10, while the second structure has the ion-implanted regions 11 applied only to the channel regions located between the n-type diffused regions 12, as shown in FIG. 7A. This structure is intended to solve a problem that the donors in the n-type diffused regions 12 formed by diffusing As are compensated by the B ions, which are implanted into the whole substrate in the core area to form the ion-implanted region 11.

The n-type diffused regions 12 that serve as bit lines are arranged at given intervals by implantation of As on the main surface of the p-type semiconductor substrate 10. The channel ion implantation of B ions are applied to the channel regions between the n-type diffused regions for the purpose of adjusting the threshold value of each bit. In this manner, the ion-implanted regions 11 that vertically extend from the surface of the semiconductor device 10 are formed therein in order to adjust the threshold values.

The multi-bit cells can be produced in the following process. In the following description, the process carried out until the well regions 16 are formed in the cell peripheral area is the same as that employed in the first embodiment, and a description thereof is therefore omitted here.

In the present embodiment, the n-type diffused regions 12 are formed in the core area, and the ion-implanted regions 11 for the adjustment of the threshold values are then formed. More specifically, the polysilicon film 19 is deposited and is photolithographically shaped into a polysilicon mask for forming the bit lines. As ions are implanted through openings of the polysilicon mask to form the n-type diffused regions 12 (FIG. 8A). The conditions of As ion implantation are the same as those in the first embodiment.

Next, the nitride sidewall films 22 are formed by the same process as that used in the first embodiment, and B ions are implanted through the openings between the sidewall films 22 to form the ion-implanted regions 11 for the adjustment of the threshold values (FIG. 8B). Since the nitride film that is approximately 200 nm thick covers the bit lines, the B ions implanted at an acceleration voltage equal to or lower than 80 keV do not pass through the nitride film. It is thus possible to implant B ions in the centers of the channels and the areas close thereto at a dose of $6 \times 10^{12}$ cm$^{-2}$ and an acceleration voltage of 40 keV. It is to be noted that ion implantation is carried out by the self-alignment with the nitride sidewall films 22 rather than the mask process. It is therefore possible to position the ion-implanted regions 11 for the adjustment of the threshold values with high precision.

The widths of the openings between the nitride sidewall films 22 can be selected by controlling the thicknesses of the sidewall films 22, and the widths of the ion-implanted regions can be controlled.

The process that follows the above is the same as that described previously in connection with the first embodiment. The oxide film 18 located in the openings defined by the nitride sidewall films 22 is removed and the exposed surface is re-oxidized. This oxidizing process forms the tunnel oxide film 13 that has the thin-film portions 13a (which is approximately 7 nm) and the thick-film portions 13b. After the nitride sidewall films 22 are removed, the insulative nitride film 14 for charge storage and the upper oxide film 15 are sequentially laminated on the tunnel oxide film 13 (FIG. 8C).

In the above-mentioned manner, the semiconductor device of the present invention shown in FIGS. 7A and 7B can be fabricated.

The present embodiment uses the nitride sidewall films 22 as a mask for forming the ion-implanted regions 11. This makes it possible to precisely implant ions only in the regions 11 for the adjustment of the threshold values at an arbitrary energy and/or an arbitrary dose and to improve programming and read performance.

Third Embodiment

The semiconductor device of the present embodiment has a structure similar to that shown in FIGS. 7A and 7B, but has a process for forming the n-type diffused regions different from that employed in the second embodiment.

FIGS. 9A through 9D describe the process of forming the n-type diffused regions of the present invention, wherein the left-side figures show the core area and the right-side figures.

Figure 9A:
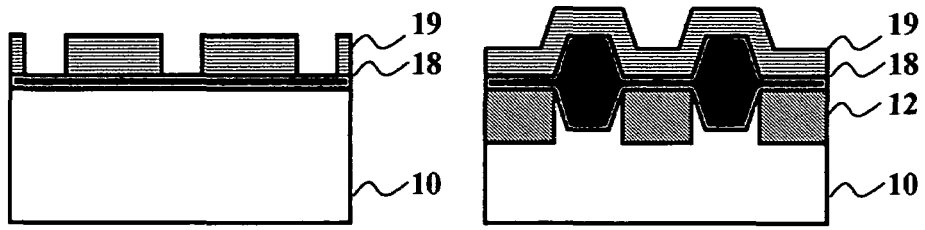
FIGS. 9A through 9D are respectively views for describing a process of forming an n-type diffused region according to a third embodiment.

The thin oxide film (having a thickness of approximately 7 nm) is uniformly formed on the main surface of the semiconductor substrate 10, and the polysilicon film 19 is deposited on the oxide film 18. Then, the polysilicon film 19 is partially etched by the photolithographic process to form openings arranged at given intervals (FIG. 9A).

Figure 9B:
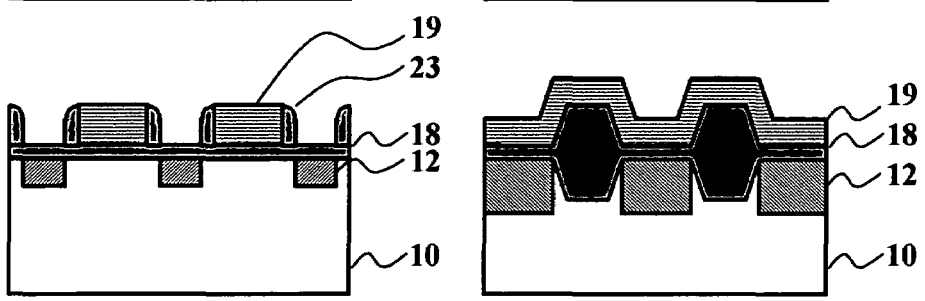

Next, a nitride film is uniformly deposited and is etched to form nitride sidewall films 23 on opposite sides of the patterned polysilicon films 19 arranged on the thin oxide film 18 at given intervals. After that, As ions are implanted through the openings between the sidewall films 23, so that the n-type diffused regions 12 that are the bit lines are formed (FIG. 9B). The widths of the openings between the nitride sidewall films 23 can be selected by controlling the thicknesses of the nitride sidewall films 23, so that the widths of the bit lines can be controlled.

Figure 9C:
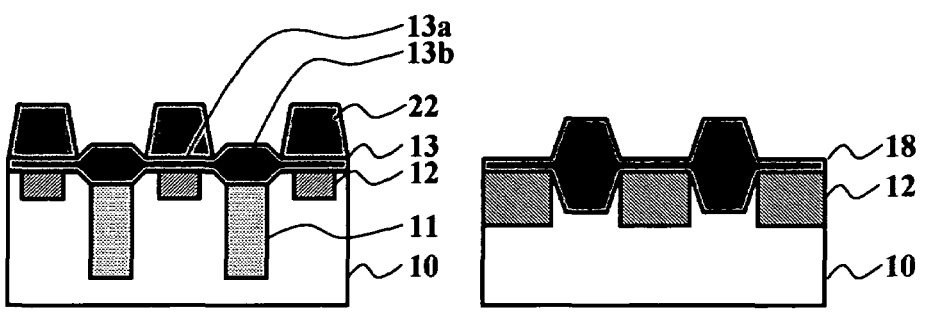

Subsequently, the nitride sidewall films 22 are formed by the same process as that employed in the first and second embodiments, and B ions are implanted through the openings defined by the sidewall films 22 to form the ion-implanted regions 11 for the adjustment of the threshold values. Then, the oxide film existing in the openings defined by the nitride sidewall films 22 are removed, and the exposed surface is re-oxidized. In this manner, the tunnel oxide film 13 composed of the thin-film portions 13a and the thick-film portions 13b can be formed (FIG. 9C).

Figure 9D:
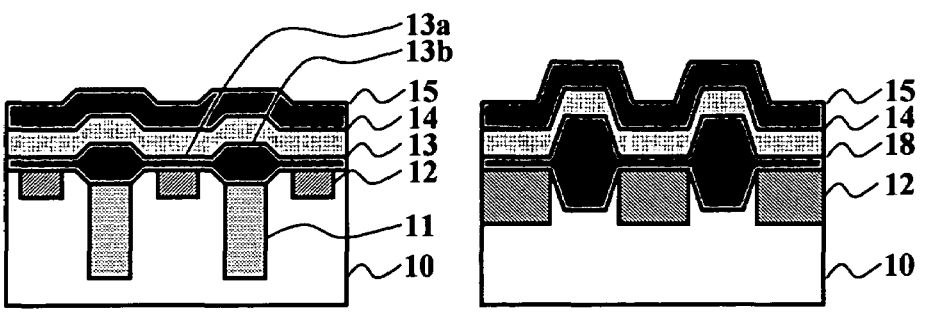

Finally, the nitride sidewall films 22 are removed, and the insulative nitride film 14 and the upper oxide film 15 are laminated in turn on the tunnel oxide film 13 (FIG. 9D).

The process of forming the ion-implanted regions 11 for the adjustment of the threshold values may be carried out prior to the bit line forming process.

The semiconductor device of the present embodiment uses the nitride sidewall films 23 as the mask for the n-type diffused regions 12 that are the bit lines. It is therefore possible to form the n-type diffused regions with high precision and miniaturize the device without degrading the programming and read performance.

The present invention provides the semiconductor device capable of normally programming the bits in the same cell without being affected by the amounts of charges of other bits and miniaturizing the multi-bit cells without degrading the programming and read performance, and provides the method of fabricating the same.

The tunnel oxide film of the present invention has end portions that are made thin to enable data programming and erasing and channel center portions that are made thick to prevent tunneling of electrons. Thus, the threshold value of each of the bits located so as to sandwich the channel center portion is not affected by the amount of charge in the other bit, and variation (increase) of the threshold value of each bit does not occur. Thus, the problem about the errors that may occur during the data read can be solved. Further, programming and erasing of each of the bits provided in the same cell can normally be performed without any dependence of the charge amount in the other bit or bits.

The semiconductor device of the present invention has the ion-implanted regions for the adjustment of the threshold values using the nitride sidewall films as a mask. It is thus possible to precisely implant ions into the channel ion-implanted regions for the adjustment of the threshold values at an arbitrary energy and/or an arbitrary dose. This improves the programming and read performance.

The semiconductor device of the present invention has diffused regions using the nitride sidewall films as a mask. It is thus possible to form the diffused regions with high precision and miniaturize the device without degrading the programming and read performance.

The present invention is not limited to the specifically disclosed embodiments, and other embodiments and variations may be made without departing from the scope of the present invention.

What is claimed is:

1. A semiconductor device comprising:
a substrate having a pair of first diffused regions; and
a gate including an oxide film provided on the substrate, and a charge storage layer provided on the oxide film, the charge storage layer being an electrical insulator capable of storing charges in bit areas,
the oxide film having first portions related to the bit areas and a second portion that is located between the bit areas and is thicker than the first potions,
the first portions serving as tunneling oxide portions, while the second portion allows reduced tunneling.

2. The semiconductor device as claimed in claim 1, wherein:
the first diffused regions selectively serve as a source and a drain in accordance with a condition for biasing; and
the pair of first diffused regions are symmetrically arranged at both ends of a channel.

3. The semiconductor device as claimed in claim 1, wherein the substrate includes a threshold control region that controls threshold levels of the bit areas.

4. The semiconductor device as claimed in claim 1, further comprising a second diffused region in which the pair of first diffused regions is located.

5. The semiconductor device as claimed in claim 1, further comprising a second diffused region located between the pair of first diffused regions.

6. The semiconductor device as claimed in claim 1, further comprising a second diffused region that is separate from the pair of first diffused regions.

7. The semiconductor device as claimed in claim 1, further comprising a second diffused region that is separate from the pair of first diffused regions and is located at a central portion of the channel.

8. The semiconductor device as claimed in claim 7, wherein the second diffused region extends vertically from a surface of the substrate.

9. The semiconductor device as claimed in claim 3, wherein the threshold control region includes an ion-implanted region.

10. The semiconductor device as claimed in claim 1, wherein the pair of first diffused regions has a buried bit line structure, and the semiconductor device comprises a plurality of pairs of first diffused regions.

11. The semiconductor device as claimed in claim 1, wherein the substrate is a silicon substrate, and the oxide film is a silicon oxide film, the charge storage layer being a silicon nitride film.

12. The semiconductor device as claimed in claim 1, wherein the gate has a MNOS (Metal-Nitride-Oxide-Semiconductor) or SONOS (Silicon-Oxide-Nitride-Oxide-Semiconductor) structure.

13. The semiconductor device as claimed in claim 4, wherein the second diffused region contains a dopant of boron, and the first diffused regions contain a dopant of arsenide.

* * * * *